(12) United States Patent
Yoder

(10) Patent No.: US 11,239,602 B2
(45) Date of Patent: Feb. 1, 2022

(54) ECU ASSEMBLY WITH ROTATING PCB

(71) Applicant: VEONEER US INC., Southfield, MI (US)

(72) Inventor: Jacob Jay Yoder, Dundee, MI (US)

(73) Assignee: VEONEER US INC., Southfield, MI (US)

(*) Notice: Subject to any disclaimer, the term of this patent is extended or adjusted under 35 U.S.C. 154(b) by 146 days.

(21) Appl. No.: 16/718,606

(22) Filed: Dec. 18, 2019

(65) Prior Publication Data
US 2021/0194176 A1    Jun. 24, 2021

(51) Int. Cl.
| H01R 12/58 | (2011.01) |
| H01R 13/504 | (2006.01) |
| H01R 13/506 | (2006.01) |
| H01R 13/52 | (2006.01) |
| H01R 43/20 | (2006.01) |
| H01R 43/00 | (2006.01) |
| H01R 13/66 | (2006.01) |
| H01R 43/18 | (2006.01) |

(52) U.S. Cl.
CPC ......... *H01R 13/5219* (2013.01); *H01R 12/58* (2013.01); *H01R 13/504* (2013.01); *H01R 13/665* (2013.01); *H01R 43/005* (2013.01); *H01R 43/18* (2013.01); *H01R 43/205* (2013.01)

(58) Field of Classification Search
CPC .. H01R 13/5219; H01R 13/58; H01R 13/504; H01R 13/665; H01R 13/506; H01R 12/58; H01R 43/005; H01R 43/18; H01R 43/205
See application file for complete search history.

(56) References Cited

U.S. PATENT DOCUMENTS

| 6,962,499 | B2* | 11/2005 | Yamamoto | H01R 13/4361 439/541.5 |
| 9,277,658 | B2* | 3/2016 | Tanaka | H05K 5/0069 |
| 9,756,741 | B2* | 9/2017 | Blossfeld | H01R 13/41 |
| 2012/0276761 | A1* | 11/2012 | Martin | H01R 12/724 439/83 |
| 2015/0009640 | A1* | 1/2015 | Stern | H01R 13/6658 361/752 |
| 2017/0187139 | A1* | 6/2017 | Dekoski | H01R 12/716 |
| 2019/0229484 | A1* | 7/2019 | Cen | H01R 12/722 |

* cited by examiner

*Primary Examiner* — Edwin A. Leon
*Assistant Examiner* — Milagros Jeancharles
(74) *Attorney, Agent, or Firm* — Christopher P. Maiorana, PC

(57) ABSTRACT

A method of assembling an electronic control unit comprises assembling a printed circuit board (PCB) substrate with a terminal carrier holding a plurality of terminal pins comprising a right angle bend into a housing using a rotational motion. The terminal carrier generally extends perpendicularly from the PCB substrate. A first end of each of the plurality of terminal pins is inserted into the PCB substrate and a second end of each of the plurality of terminal pins extends through the terminal carrier. The second ends of the plurality of terminal pins generally extend into one or more connector openings in one of four sides of the housing and the terminal carrier interlocks with the housing to hold the PCB substrate with the terminal carrier and the plurality of terminal pins in place.

20 Claims, 14 Drawing Sheets

ECU ASSEMBLY WITH ROTATING PCB

FIELD OF THE INVENTION

The invention relates to automotive control assemblies generally and, more particularly, to a method and/or apparatus for implementing electronic control unit (ECU) assembly with a rotating printed circuit board (PCB).

BACKGROUND

In manufacturing electronic control modules, it is difficult and/or expensive to produce a sealed module containing right angle connectors due to multiple interfaces requiring sealing. Manufacturers commonly specify sealing levels for fully assembled electronic modules. One or more connectors are typically included on the electronic modules to make electrical connections between printed circuit boards within the modules and vehicle harnesses outside the modules. In some applications, the automotive industry often requires an electronic control module be sealed to the environment. Thus, the control module connector needs to eliminate potential leak paths.

International Electrotechnical Commission (IEC) standard 60529, "Degrees of Protection Provided by Enclosures (IP Codes)," Ed. 2.2 (Geneva: International Electrotechnical Commission, 2013), classifies the degrees of protection provided against the intrusion of solid objects (including body parts like hands and fingers), dust, accidental contact, and water in electrical enclosures. The standard aims to provide users more detailed information than vague marketing terms such as waterproof. The automotive industry requirements vary from sealing a module from a light water spray (e.g., IP 53) to complete immersion to a depth of 1 meter for 30 minutes (e.g., IP 67/68). In some applications, sealing to pressures up to 6 psi (e.g., IP 68) is required. In some cases the pressure differential is created due to an application requirement to preheat the module to 85° C. prior to conducting the water spray or immersion testing.

Possible leak paths between the connectors and electronic module housings are commonly sealed with dispensed seals or gaskets, or the use of potting or bonding components outside the housings to fill gaps. The conventional design approaches are expensive and have other shortcomings.

It would be desirable to implement electronic control unit (ECU) assembly with a rotating printed circuit board (PCB).

SUMMARY

The invention concerns a method of assembling an electronic control unit comprising assembling a printed circuit board (PCB) substrate with a terminal carrier holding a plurality of terminal pins comprising a right angle bend into a housing using a rotational motion. The terminal carrier generally extends perpendicularly from the PCB substrate. A first end of each of the plurality of terminal pins is inserted into the PCB substrate and a second end of each of the plurality of terminal pins extends through the terminal carrier. The second ends of the plurality of terminal pins generally extend into one or more connector openings in one of four sides of the housing and the terminal carrier interlocks with the housing to hold the PCB substrate with the terminal carrier and the plurality of terminal pins in place.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include a method and/or an apparatus providing electronic control unit (ECU) assembly with a rotating printed circuit board (PCB) that may (i) limit sealing to only one interface, (ii) be cost effective to manufacture, (iii) eliminate a potential leak path between the connector shrouds and housing by integrating the connector geometry into the housing, (iv) provide a method of assembling terminal pins to a printed circuit board (PCB) that is robust and accommodating to different pin sizes and spacing, (v) improve overall quality by allowing a metal comb to be used to support a press fit force when inserting the terminal pins into the PCB, and/or (vi) provide better control over pin location and insertion depth.

An electronic control module (ECM) enclosure typically contains some type of housing and one or more connectors. One difficulty in designing an integral connector housing is to be able to support a press fit force associated with assembling a printed circuit board (PCB) to the integral connector of the housing. By designing a housing with the features of the invention, a terminal carrier may be assembled to the PCB prior to the PCB being assembled to the housing. The separate assembly generally allows a press fit force to be supported by a tool rather than the terminals and/or the housing. The housing design in accordance with an embodiment of the invention may decrease cost by removing labor and/or expensive insert molding from a supplier. The terminal carrier and attached PCB may be fastened to the housing by various methods including, but not limited to, guide features, snap fits, screws, and/or some type of welding. In various embodiments, terminal alignment plates may also be used to ensure true positioning of the terminal pins.

Figure 1:
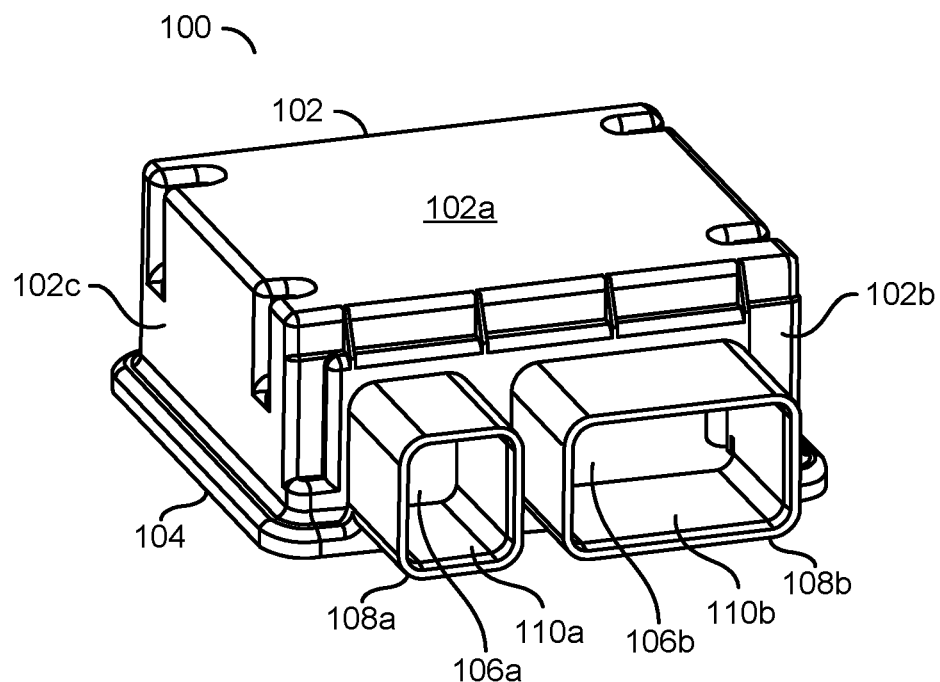
FIG. 1 is a diagram illustrating a perspective view of an apparatus housing in accordance with an example embodiment of the invention.

Referring to FIG. 1, a diagram is shown illustrating a housing 100 in accordance with an example embodiment of the invention. In various embodiments, the housing (or enclosure) 100 may be part of an electronic control unit (or module). In an example, the electronic control unit (ECU) may be configured for application in a motor vehicle. In various embodiments, the housing (or enclosure) 100 comprises an upper housing 102 and a lower housing (or cover or baseplate) 104 (not visible). While mated with the lower housing 104, the upper housing 102 may be configured to provide an environmentally sealed enclosure. The enclosure 100 may protect components and devices of a subassembly enclosed within.

In various embodiments, the upper housing 102 may be implemented as a non-conductive enclosure. In various embodiments, the upper housing 102 generally comprises a plastic or resin based material. In various embodiments, the plastic material may include, but is not limited to, polyamide (NYLON), polybutylene terephthalate (PBT), polypropylene, polyethylene terephthalate (PET), acrylonitrile butadiene styrene (ABS), and/or various alloys and/or fillers of these resins. Other materials may be implemented to meet the design criteria of a particular application.

In various embodiments, the upper housing 102 generally includes five sides 102a-102e. In an example, the side 102a may be referred to as a top of the upper housing 102 and the sides 102b-102e may extend approximately perpendicularly from the side 102a. The terms upper and top are used for convenience of description and not as an indication a particular orientation of the electronic control module housing 100 is required. In various embodiments, one of the sides (e.g., 102b) of the upper housing 102 may include two connector openings 106a and 106b. The two connector openings 106a and 106b may be surrounded by respective connector shrouds (or cowlings) 108a and 108b. Other numbers of connector openings and shrouds (e.g., 1 to n) may be implemented accordingly to meet design criteria of a particular implementation. The connector shrouds 108a and 108b are generally integrated into the upper housing 102. In an example, the upper housing 102 and the connector shrouds 108a and 108b may be molded (made) as a single piece. Molding or otherwise incorporating the connector shrouds as part of the upper housing (enclosure) generally eliminates a need for sealing the connector/housing interface(s).

In various embodiments, the housing 100 generally includes an integral connector sealing feature to reduce or eliminate potential leak paths. In an example, inner surfaces 110a and 110b of the connector shrouds 108a and 108b, respectively, may be configured to seal the connector shrouds 108a and 108b to mating connector assemblies 112 (illustrated in FIG. 2) so the connector openings 106a and 106b within the connector shrouds 108a and 108b do not present a potential leakage path into an interior of the housing 100. In an example, the mating connector assemblies 112 may comprise an O-ring 114 (illustrated in FIG. 2) or some other type of gasket or seal configured to seal against the inner surfaces 110a and 110b of the connector shrouds 108a and 108b.

In an example, the lower housing (or cover or baseplate) 104 may be implemented as a die-cast aluminum baseplate. In another example, the lower housing (or cover or baseplate) 104 may be implemented as a stamped steel baseplate. Implementing the lower housing 104 with a metallic material may aid in dissipating heat generated by circuitry within the sealed enclosure 100. In various embodiments, the lower housing 104 may be machined to create a sealing surface against which a gasket placed between the upper housing 102 and the lower housing 104 may form a seal when the upper housing 102 and the lower housing 104 are fastened together.

In some embodiments, the lower housing 104 may be configured to provide a mounting footprint for the electronic control module housing 100. In an example, the lower housing 104 may be implemented with an RCM8 mounting footprint to simplify testing. However, other footprints may be implemented to meet the design criteria of a particular application. In an example, the housing 100 may be implemented similarly to a housing described in co-pending U.S. Non-provisional application Ser. No. 15/925,665, which is incorporated by reference in its entirety.

In an example, the connector shroud 108a may be configured to accept a 52-pin connector and the connector shroud 108b may be configured to accept a 104-pin connector. The 52 and 104 pin connectors may be configured to provide electrical connections to a circuit board enclosed within the enclosure 100. In an example, the connectors may be implemented as 1.8 mm pitch Nano connectors. However, other types and sizes of connectors may be implemented to meet the design criteria of a particular implementation.

Figure 2:
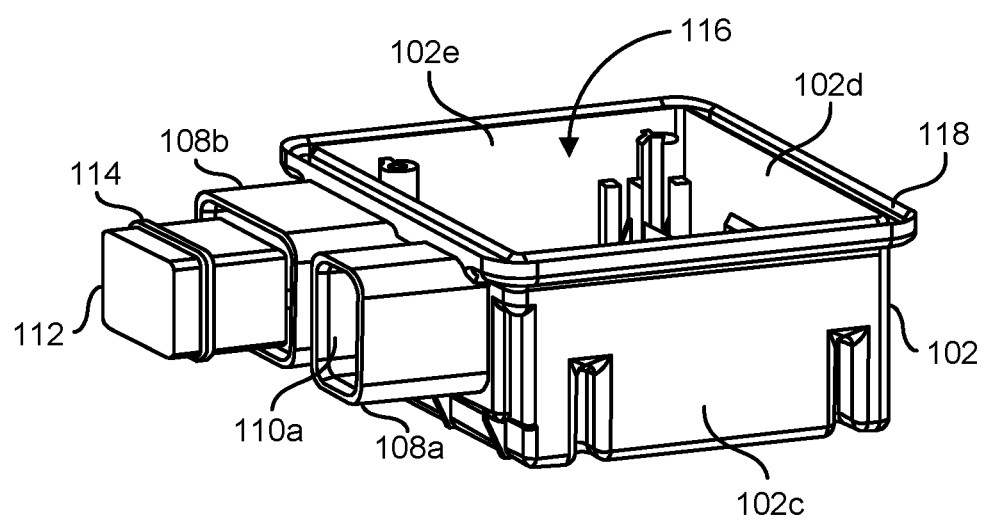
FIG. 2 is a diagram illustrating an opening in an upper housing of the apparatus in accordance with an example embodiment of the invention.

Referring to FIG. 2, a diagram is shown illustrating an opening in the upper housing 102 facilitating an assembly process in accordance with an example embodiment of the invention. The five sides 102a-102e of the upper housing 102 generally define an interior space (e.g., rectilinear volume) within the housing 100. The five sides 102a-102e generally leave an opening 116 through which a pre-assembled terminal carrier and printed circuit board assembly may be inserted during manufacturing. In an example, the pre-assembled terminal carrier and printed circuit board assembly is generally inserted using a rotational motion followed by a translational motion into the interior space of the upper housing 102 (e.g., illustrated in FIGS. 11-14). The opening 116 into the upper housing 102 is generally closed by assembly of the lower housing 104 to the upper housing 102. In various embodiments, the upper housing 102 may include geometry (e.g., groove, etc.) 118 to accommodate a gasket, dispensed type sealant or adhesive sealant, or welded cover to seal the interface between the upper housing 102 and the lower housing 104.

Figure 3:
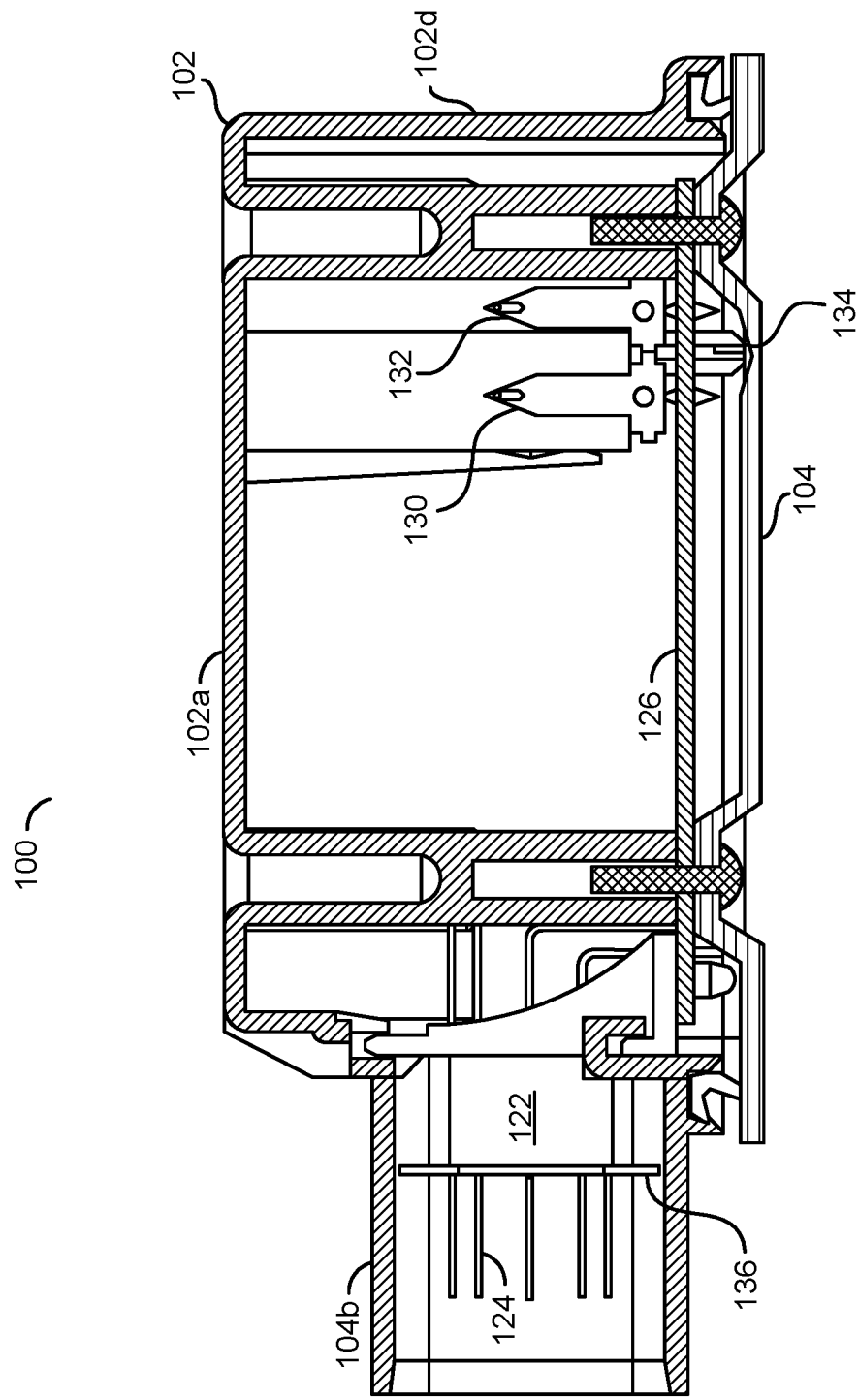
FIG. 3 is a cross-sectional view illustrating a circuit board with terminal carrier installed in the control unit case.

Referring to FIG. 3, a cross-sectional view is shown illustrating a circuit board assembly 120 installed in the electronic control module housing 100. In various embodiments, the circuit board assembly generally comprises a terminal carrier 122 holding a plurality of terminal pins 124 to a printed circuit board substrate 126. The terminal carrier 122 is generally configured to maintain a dimensional relationship between the terminal pins 124. The terminal carrier 122 also supports the terminal pins 124 on the printed circuit board substrate 126. In an example, a first end of the terminal pins 124 may be stitched into the terminal carrier 122, then the terminal pins 124 may be bent to a right angle, then the terminal carrier assembly (e.g., the terminal carrier 122 and the terminal pins 124) may be mounted to the printed circuit board substrate 126 by inserting a second end of the terminal pins 124 into plated holes of the printed circuit board substrate 126 to create the circuit board assembly 120. In various embodiments, the terminal pins 124 may be press fit (e.g., compliant pins) or soldered to the printed circuit board substrate 126. The circuit board assembly 120 is generally inserted into the upper housing 102 using rotational and translational motions. A gasket or dispensed sealant is generally applied to the upper housing 102, and the lower housing (or base plate) 104 is then placed in position and fastened to the upper housing 102. In various embodiments, the lower housing (or base plate) 104 and the upper housing 102 may be fastened using fasteners (e.g., screws, rivets, etc.) or by welding, gluing, bonding, etc.

In some embodiments, the upper housing 102 may also contain insulation displacement connectors (IDCs) 130 and 132. The IDCs 130 and 132 may be configured to electrically connect a component (e.g., a capacitor) to the printed circuit board substrate 126. In designs where the upper housing 102 holds a capacitor and the insulation displacement contacts 130 and 132, the insulation displacement contacts 130 and 132 are generally pressed onto the capacitor leads. The upper housing 102 may also contain an alignment post 134 in close proximity of the insulation displacement contacts 130 and 132 to guide the printed circuit board substrate 126 into alignment with the insulation displacement contacts 130 and 132. The IDCs 130 and 132 may comprise compliant pins that may be inserted (or press fit) into plated holes on the printed circuit board substrate 126. Compliant pins generally need some insertion (or press fit) force in order to be assembled to plated holes in a printed circuit board (PCB). The upper housing 102 may be configured to support the press fit force of the compliant pin portion of the IDCs 130 and 132 being assembled to the printed circuit board substrate 126.

Figure 4:
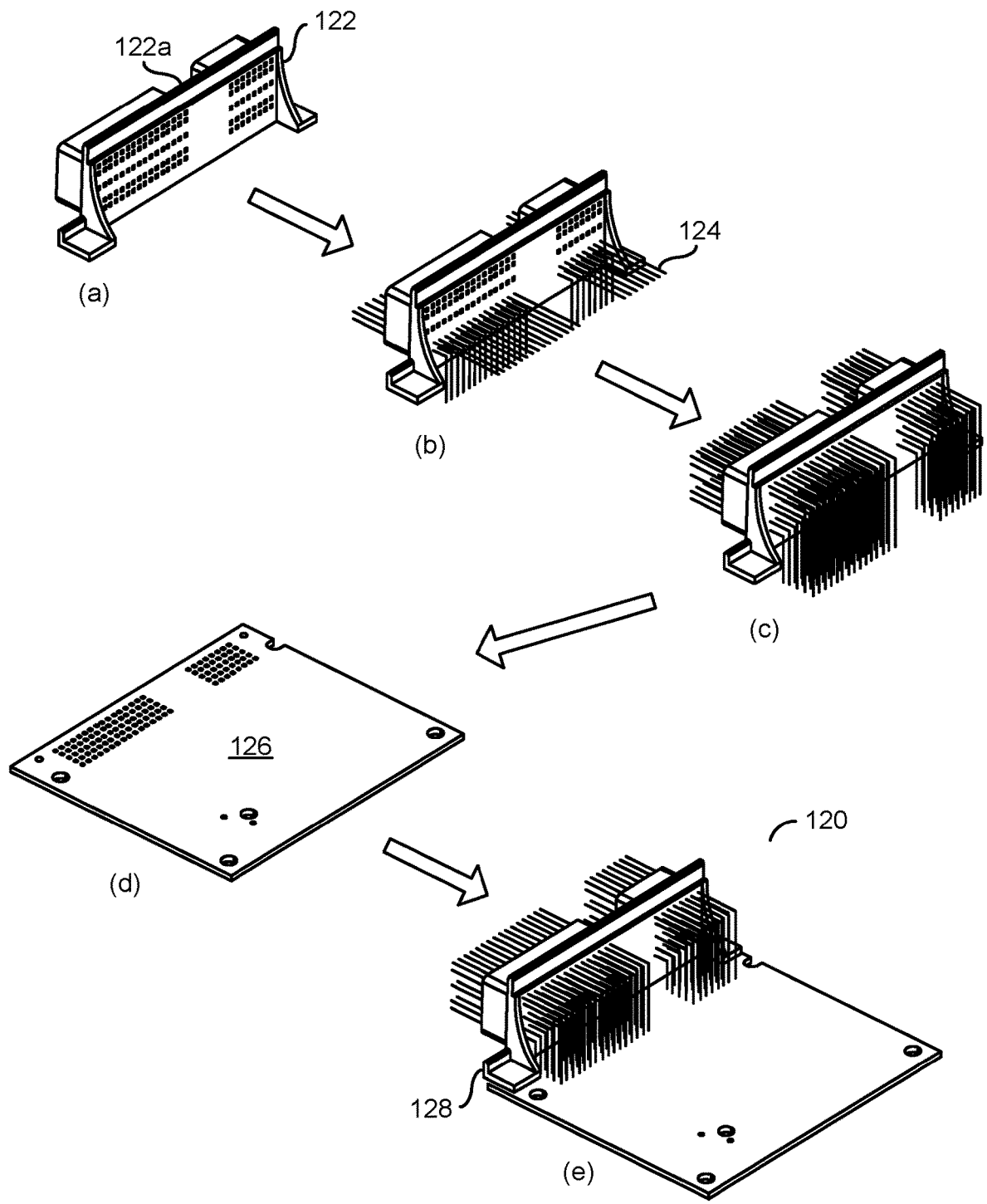
FIG. 4 is a diagram illustrating an assembly process for a circuit board assembly in accordance with an example embodiment of the invention.

Referring to FIG. 4, a diagram is shown illustrating a number of steps (a)-(e) of an assembly process for a circuit board assembly in accordance with an example embodiment of the invention. In a step (a), a raw terminal carrier 122 may be fed to a stitching station. In a step (b), the stitching station may stitch a row of terminal pins 124 into the raw carrier 122. The stitching station may then pass the stitched carrier 122 to a form station, where the form station forms an appropriate (e.g., 90 degrees, etc.) bend for the current row. The stitching and forming processes may be repeated until a number or rows of terminal pins 124 desired have been stitched and formed to produced the completed terminal carrier assembly (e.g., illustrated in step (c)). The completed terminal carrier assembly may then be assembled to the printed circuit board substrate 126 in the step (d) to obtain the circuit board assembly 120 (e.g., illustrated in step (e)).

In various embodiments, the terminal carrier 122 generally includes a feature 128 on each side (end) of the terminal carrier 122. The features 128 are generally configured to align the terminal carrier 122 with an interior surface of the side (e.g., 102b) of the upper housing 102 containing the connector shrouds 108a and 108b. In various embodiments, a top profile 122a of the terminal carrier 122 and the features 128 may be configured to align the circuit board assembly 120 within the upper housing 102.

Figure 5:
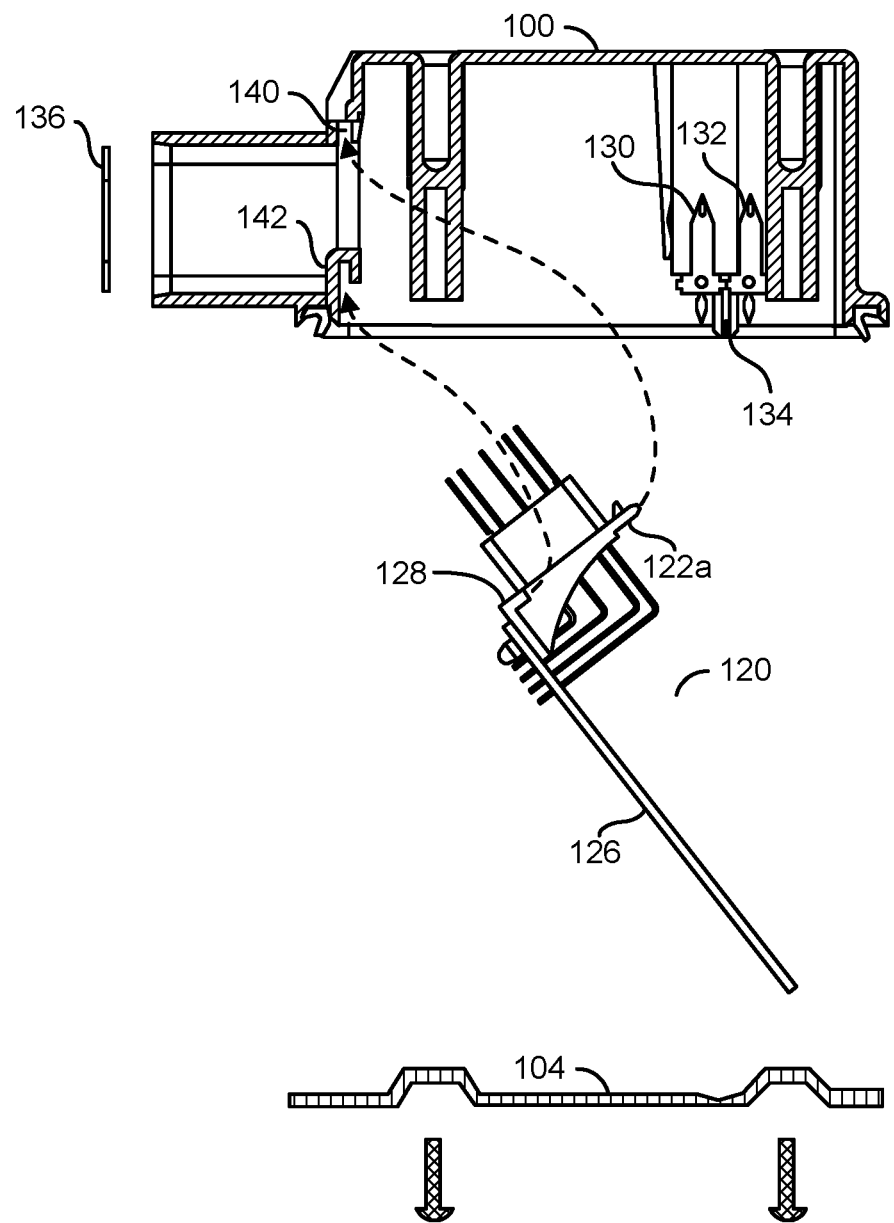
FIG. 5 is a diagram illustrating a process of inserting a circuit board assembly with terminal carrier into the opening of the upper housing of FIG. 2.

Referring to FIG. 5, a diagram is shown illustrating a process of inserting the circuit board assembly 120 with terminal carrier 122 into the bottom opening of the upper housing 102. The circuit board assembly 120 is generally inserted into the upper housing 102 by inserting the first ends of the terminal pins 124 extending through the terminal carrier 122 into the connector openings 106a and 106b and connector shrouds 108a and 108b. The circuit board assembly 120 is then rotated toward the upper housing 102 until the upper profile 122a and the features 128 of the terminal carrier 122 are substantially aligned with receiving pockets 140 and 142, respectively, of the upper housing 102. The circuit board assembly 120 is then translated into the upper housing 102 until the upper profile 122a and the features 128 are interlocked and the printed circuit board substrate 126 is seated in place. The lower housing (or base plate) 104 is then fastened to the upper housing 102 to complete the assembly.

In various embodiments, a pin alignment plate 136 may be inserted into each of the connector shrouds 108a and 108b to position the first end of the terminal pins 124 with respect to the respective connector shrouds 108a and 108b. The pin alignment plate 136 generally ensures successful insertion of the respective mating connector assemblies 112 into each of the respective connector shrouds 108a and 108b. In some embodiments, the pin alignment plate 136 may have guide rails or posts to align with the terminal carrier 122 prior to engaging with the first ends of the terminal pins 124. In some embodiments, the alignment plate 136 may have slots and/or ribs to align with the inside geometry of the connector shrouds 108a and 108b. In some embodiments, side edges of the alignment plate 136 may be configured to align with the inside geometry of the connector shrouds 108a and 108b. In some embodiments, the pin alignment plate 136 may also interface between only the terminal pins 124 and the connector shrouds 108a and 108b, excluding any interaction with the terminal carrier 122. In some embodiments, the pin alignment plate 136 may also protect against bending damage to the terminal pins 124 during handling. In an example, by only partially inserting pin alignment plates 136 into the connector shrouds 108a and 108b and leaving a small protrusion of the terminal pins 124, a bending moment may be prevented from being applied to the terminal pins 124.

Figure 6:
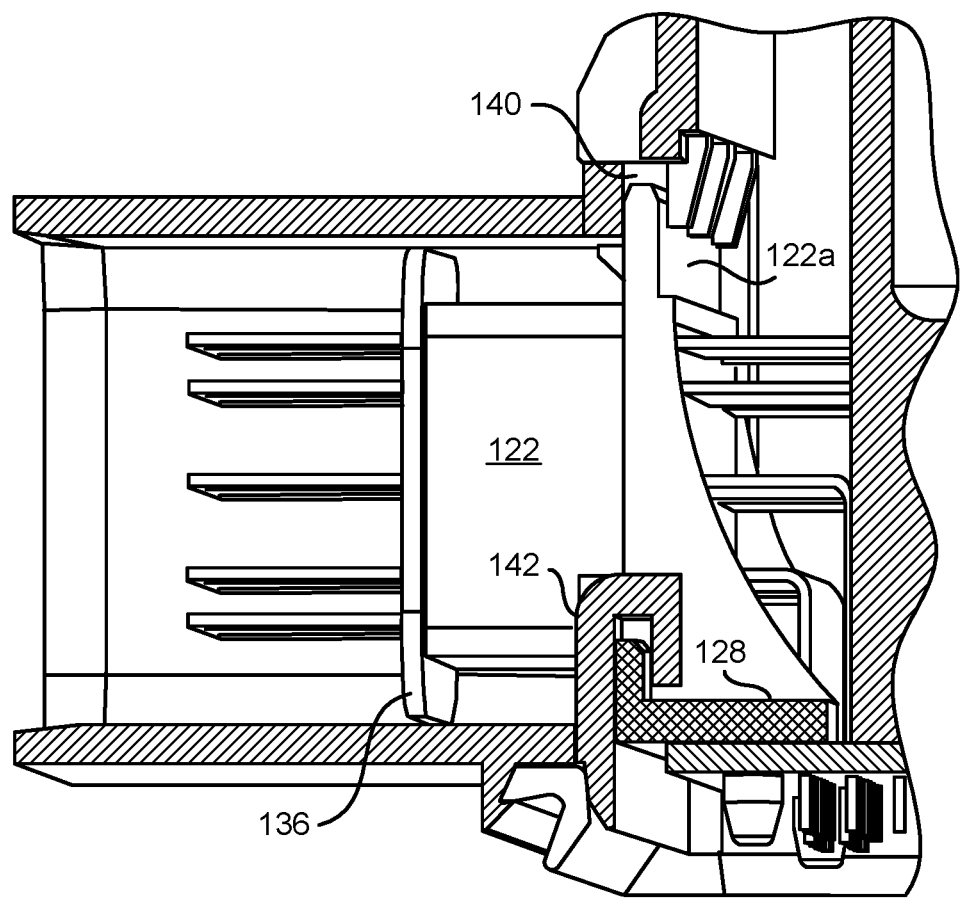
FIG. 6 is a close-up diagram showing interlocking features of the terminal carrier holding a circuit board assembly in the upper housing.

Referring to FIG. 6, a close-up diagram is shown illustrating interlocking features of the terminal carrier 122 holding a circuit board assembly 120 in the upper housing 102. In various embodiments, the upper housing 102 and the terminal carrier 122 may contain alignment features (e.g., elements 122a, 128, 140, 142) that engage during the translational insertion motion. The alignment assembly features 122a, 128, 140, and 142 generally engage at the top and bottom of the terminal carrier 122. The alignment assembly features 122a, 128, 140, and 142 are generally configured to locate the circuit board assembly 120 to the desired position within the upper housing 102, as well as to limit the force translated to the printed circuit board substrate 126 when a force is applied to the first ends of the terminal pins 124. In various embodiments, the upper housing 102 and the terminal carrier 122 may be fixed together via grooves/slots, screws, heat staking, laser welding, adhesive, and/or snap fit features.

Figure 7:
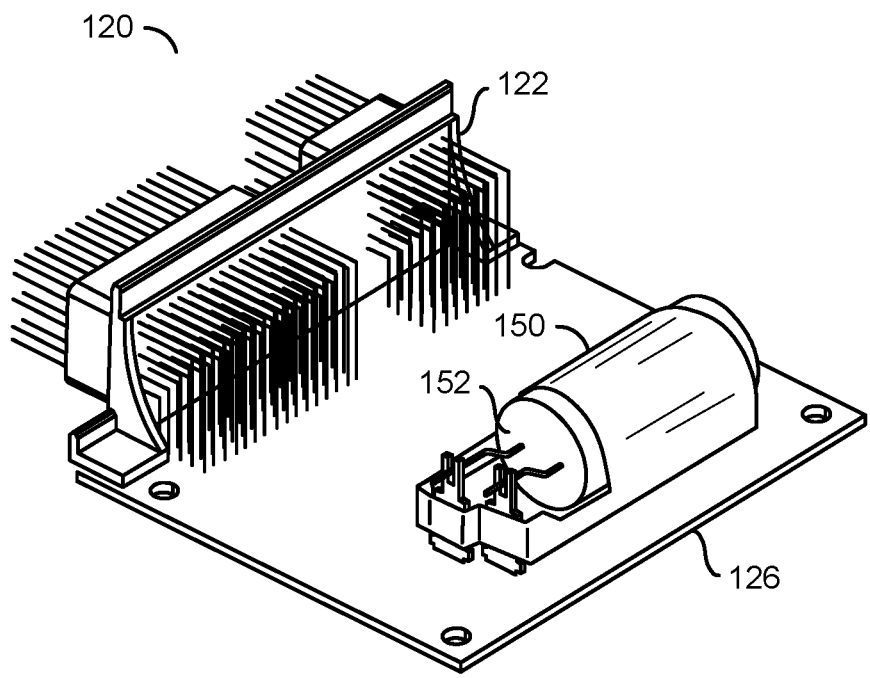
FIG. 7 is a diagram illustrating a capacitor assembly mounted on a circuit board having a terminal carrier in accordance with an embodiment of the invention.

Referring to FIG. 7, a diagram is shown illustrating a capacitor assembly 150 mounted on the printed circuit board substrate 126 having the terminal carrier 122 and terminal pins 124 in accordance with an embodiment of the invention. The capacitor assembly 150 generally combines the IDCs 130 and 132 and a capacitor 152 into a single integrated module. In some embodiments, the capacitor assembly 150 may be mounted to the printed circuit board substrate 126 of the circuit board assembly 120 prior to insertion into the upper housing 102. Mounting the capacitor assembly 150 on the printed circuit board substrate 126 eliminates the need to precisely align plated holes in the printed circuit board substrate 126 of the circuit board assembly 120 to the compliant pins of the IDCs 130 and 132 in the upper housing 102 during the assembly, thus reducing complexity. By pre-mounting the capacitor assembly 150 on the printed circuit board substrate 126, the press fit force of the IDC pin insertion may be supported by a metal tool rather than the upper housing 102.

Figure 8:
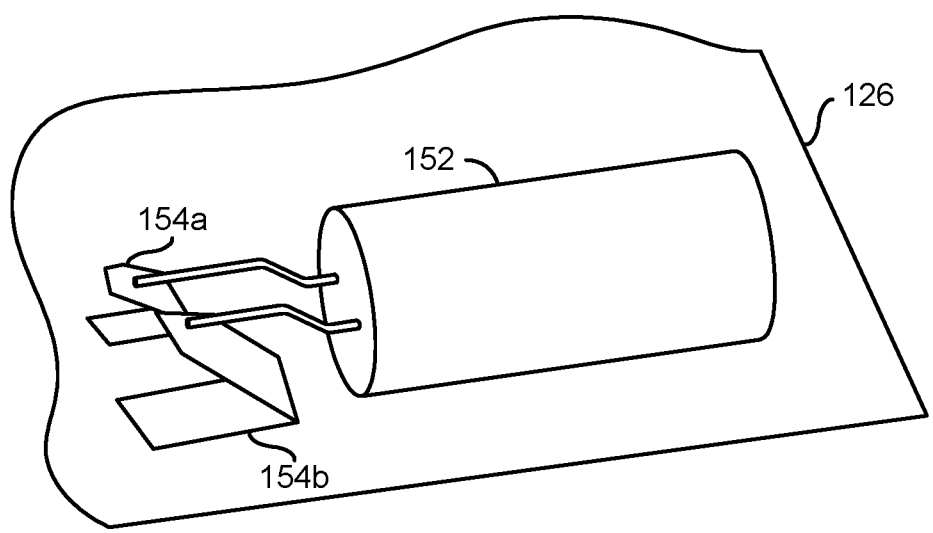
FIG. 8 is a close-up of alternative electrical contacts of the capacitor of FIG. 7.

Referring to FIG. 8, a diagram is shown illustrating a close-up of alternative electrical contacts connecting the capacitor 152 of FIG. 7 to the circuit board assembly 120. In some embodiments, connection to leads of the capacitor 152 may be made through the use of spring contacts between the capacitor leads and the printed circuit board substrate 126. The use of spring contacts may reduce the complexity of the design and assembly process between the circuit board assembly 120 and the capacitor 152.

Figure 9:
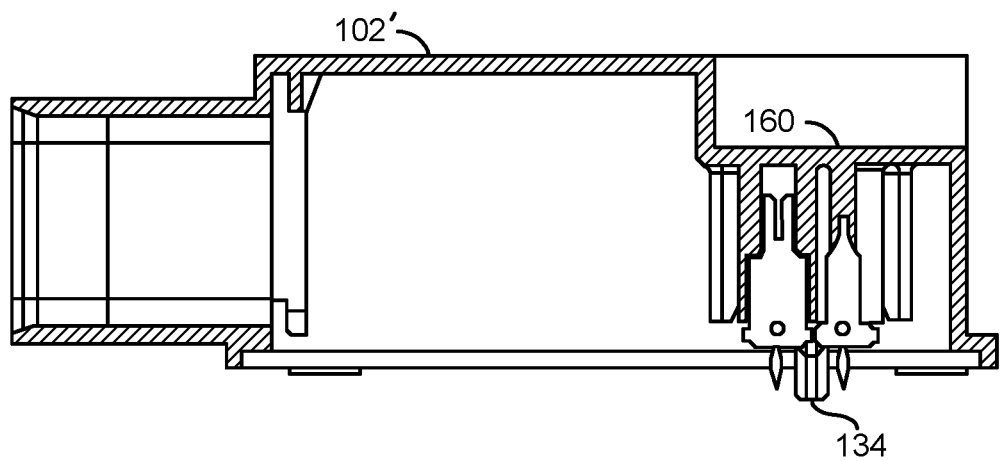
FIG. 9 is a diagram illustrating a cross sectional view of a case including insulation displacement contacts for holding a capacitor component.

Referring to FIG. 9, a diagram is shown illustrating a cross sectional view of the upper housing 102 including insulation displacement contacts 130 and 132 for holding a capacitor component. In some embodiments, the upper housing 102 may include a recessed space above the insulation displacement contacts 130 and 132. The recessed space may allow a tool to be placed against a surface 160 of the upper housing 102 to support the upper housing 102 while the press fit force is being applied to insert the compliant pin portion of the insulation displacement connectors 130 and 132 into the printed circuit board substrate 126.

Figure 10:
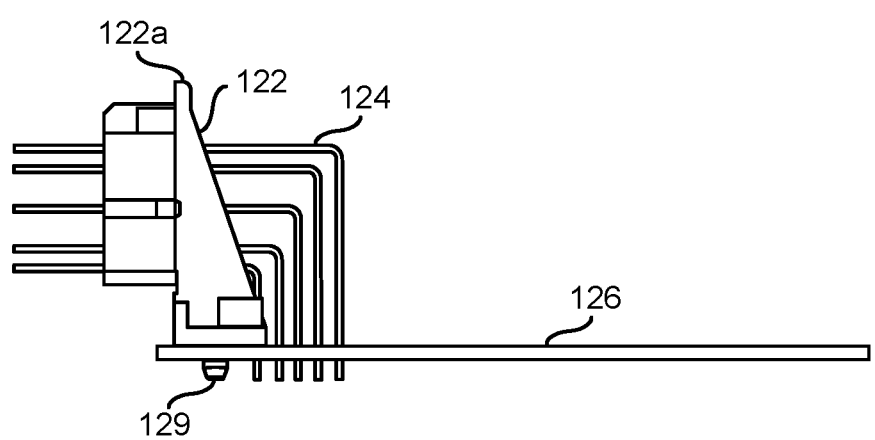
FIG. 10 is a side view of a circuit board assembly with a terminal carrier and pins mounted thereto.
Figure 11:
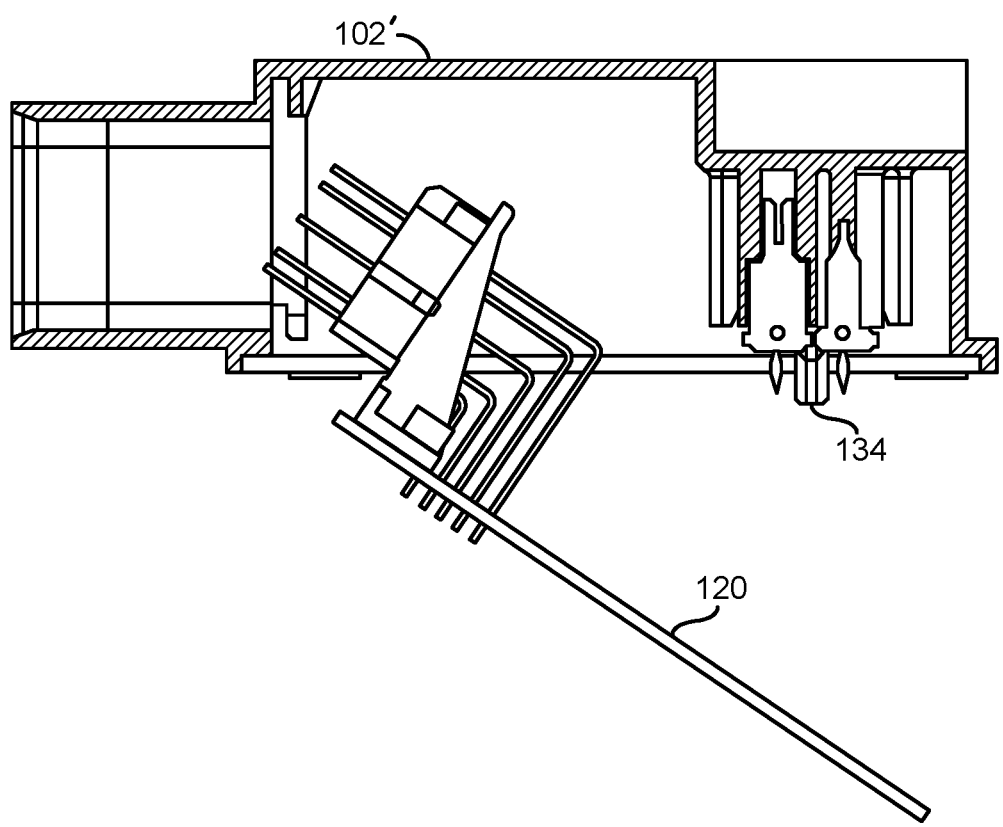
FIGS. 11-14 illustrate exemplary stages of a process of inserting a circuit board assembly with a terminal carrier into a housing.
Figure 12:
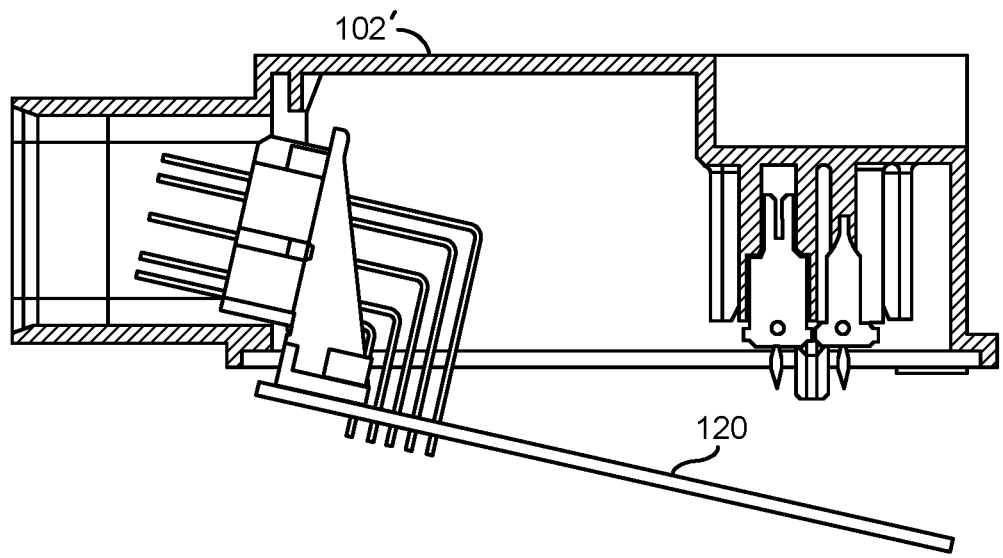

Referring to FIG. 10, a side view is shown of the circuit board assembly 120 with the terminal carrier 122 and terminal pins 124 mounted thereto. In various embodiments, the terminal carrier 122 comprises multiple rows of terminal pins 124. In various embodiments, the first ends of the terminal pins 124 are stitched into the terminal carrier 122. The terminal pins 124 generally comprise an appropriate bend (e.g., 90 degrees) for each row. The second ends of terminal pins 124 are generally assembled to (insert into) the printed circuit board substrate 126 such that the terminal carrier 122 is held in contact with a surface of the printed circuit board substrate 126. In some embodiments, the terminal carrier 122 may comprise guide pins 129 that may be configured to extend through holes in the printed circuit board substrate 126. In an example, the guide pins 129 may be configured to hold the terminal carrier 122 to the printed circuit board substrate 126.

Referring to FIGS. 11-14, diagrams are shown illustrating exemplary stages of a process of inserting the circuit board assembly 120 with the terminal carrier 122 and the terminal pins 124 into the upper housing 102 (or 102'). The circuit board assembly 120 is generally maneuvered into the upper housing 102 using rotational and translational motions to (i) situate the first end of the terminal pins 124 into the connector openings 106a and 106b and connector shrouds 108a and 108b, and (ii) seat the printed circuit board substrate 126 in the upper housing 102 (or 102'). The rotational and translational motions may be controlled by either automated equipment, manual maneuvers, or a cam profile (or profiles) in the upper housing 102 (or 102') or terminal carrier 122.

Figure 13:
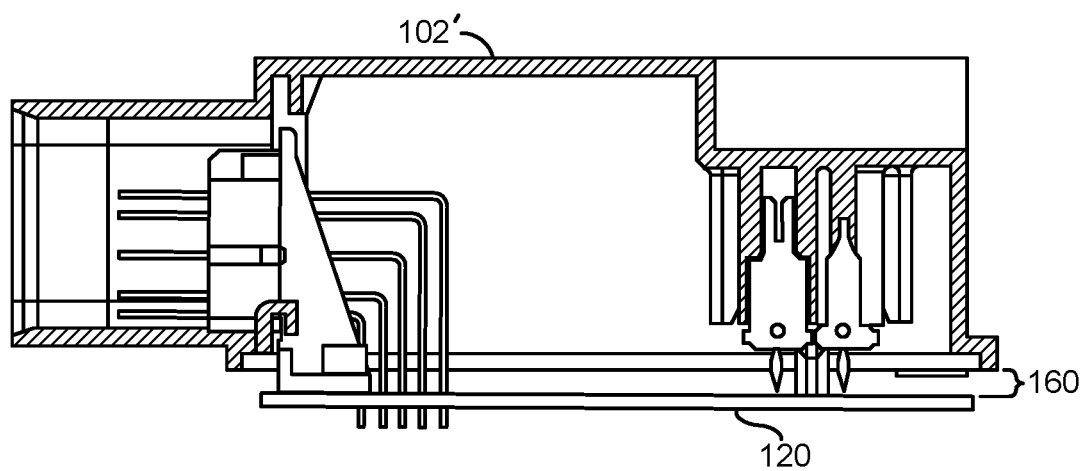
Figure 14:
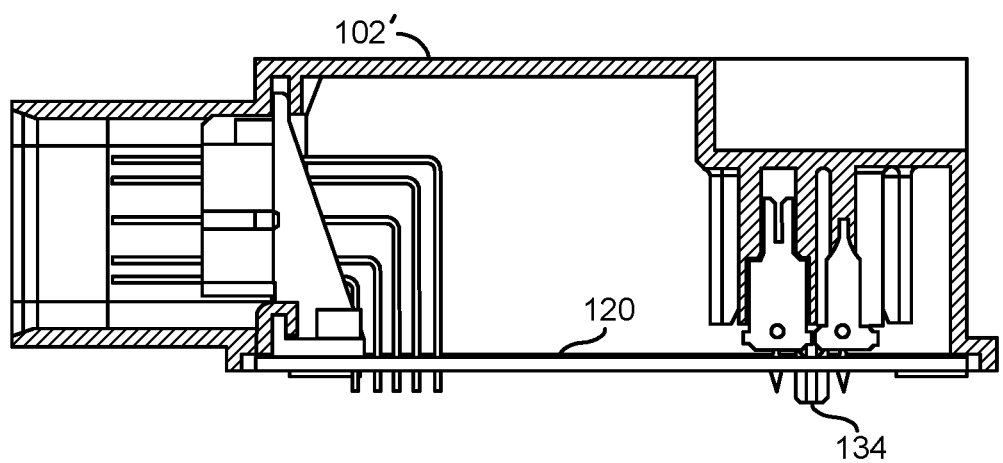

The process may begin by inserting the circuit board assembly 120 at an angle into the upper housing 102 or 102' (e.g., FIG. 11) and rotating the circuit board assembly 120 toward the upper housing 102 or 102' (e.g., FIGS. 11 and 12) until the circuit board assembly 120 becomes square (aligned) with the upper housing 102 or 102' (e.g., FIG. 13). The circuit board assembly 120 may then be then shifted (translated) toward the upper housing 102 or 102' such that the terminal pins 124 are aligned within the connector shrouds 108a and 108b, the features 122a, 128, 140, and 142 are interlocked, and the IDCs 130 and 132 are inserted into the printed circuit board substrate 126 (e.g., FIG. 14). The process may also be implemented by maneuvering the upper housing 102 to the circuit board assembly 120.

Figure 15:
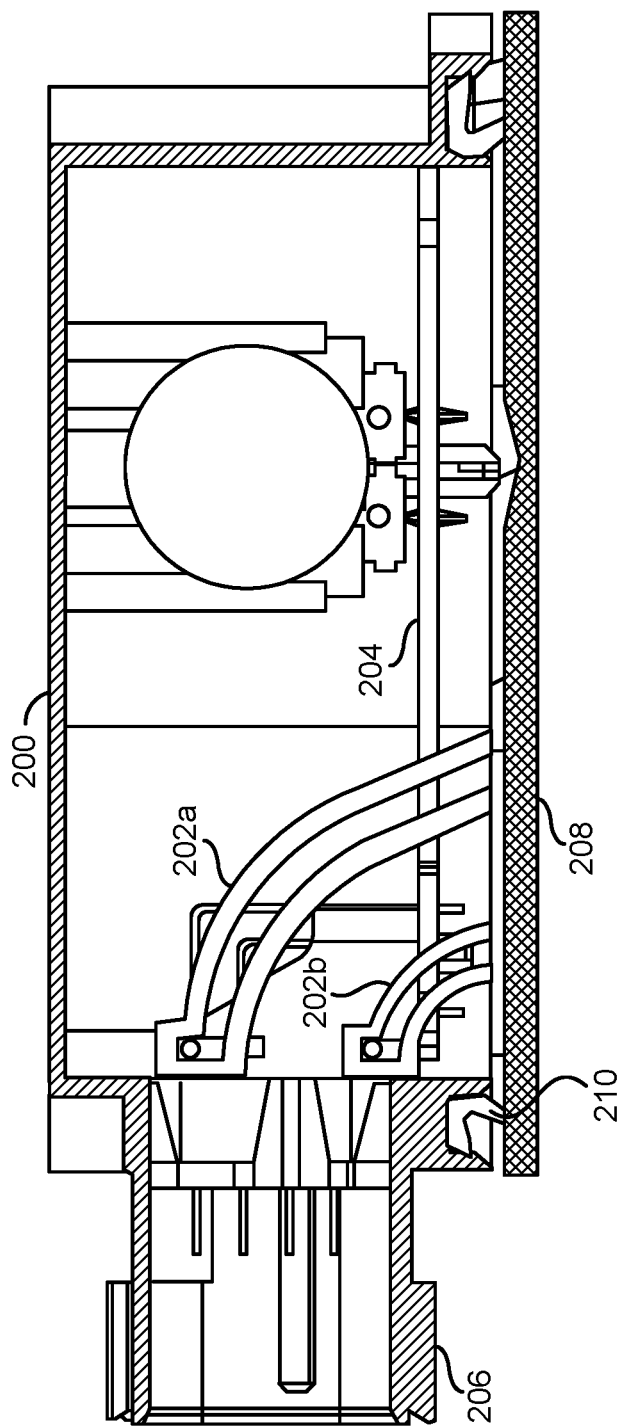
FIG. 15 is a diagram illustrating a housing having a channel feature configured to guide pins on a terminal carrier into position within the case in accordance with another example embodiment of the invention.

Referring to FIG. 15, a diagram is shown illustrating a cross sectional view of another example implementation of an upper housing in accordance with an example embodiment of the invention. In some embodiments, an upper housing 200 may include insulation displacement contacts for holding a capacitor component and cam (or channel) profiles 202a and 202b in a wall of the upper housing 200. The cam profiles 202a and 202b are generally configured to guide pins on a terminal carrier of a circuit board assembly 204 into position within the upper housing 200. Once the circuit board assembly 204 is seated in the upper housing 200, a base plate 208 may be assembled to the upper housing 200 (e.g., using screws, bonding, welding, adhesive, etc.). In some embodiments, the interior of the housing 200 may be sealed from the external environment using a gasket 210. In some embodiments, a dispensed sealant or adhesive sealant may be used in place of the gasket 210.

Figure 16:
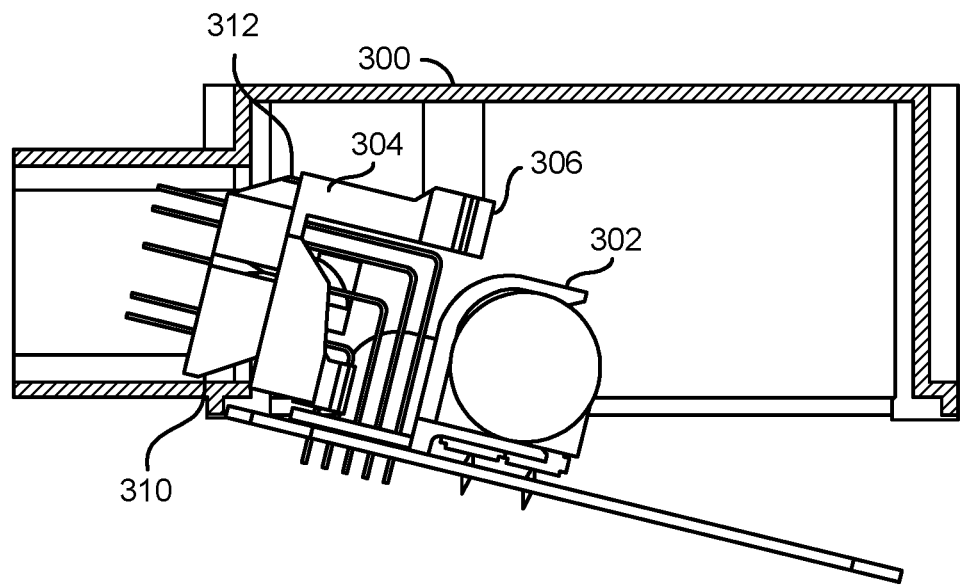
FIG. 16 and FIG. 17 are diagrams illustrating a terminal carrier in accordance with another example embodiment of the invention.
Figure 17:
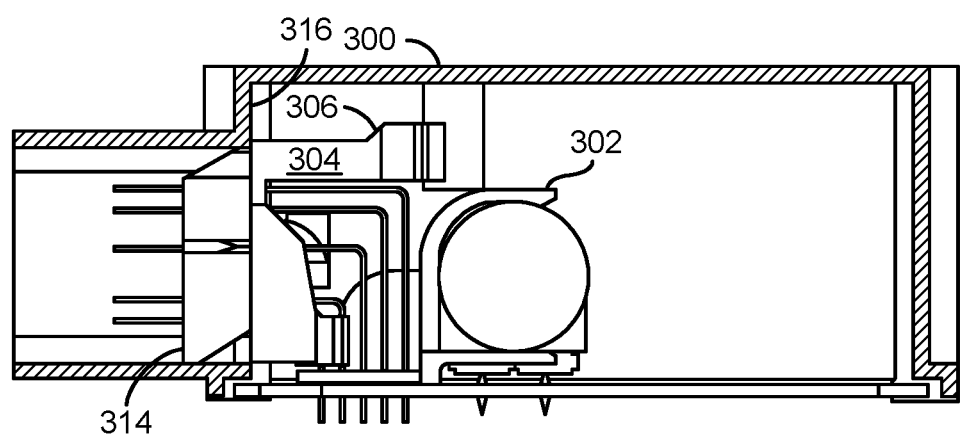

Referring to FIGS. 16 and 17, diagrams are shown illustrating a terminal carrier in accordance with another example embodiment of the invention. In embodiments where a capacitor and insulation displacement connectors assembly 302 is part of the circuit board assembly, a shift (or translation) toward an upper housing 300 is not necessary. In an example, a terminal carrier 304 on the circuit board assembly may be self-aligning to the connector shroud(s) by rotation alone. In an example, the terminal carrier 304 may include snap features 306 configured to engage a feature 308 of the upper housing 300 to hold the circuit board assembly in position. In various embodiments, the terminal carrier 304 may further include a pivot point 310, a crush feature 312, and/or a datum feature 314, and the upper housing 300 may include a datum surface 316.

Figure 18:
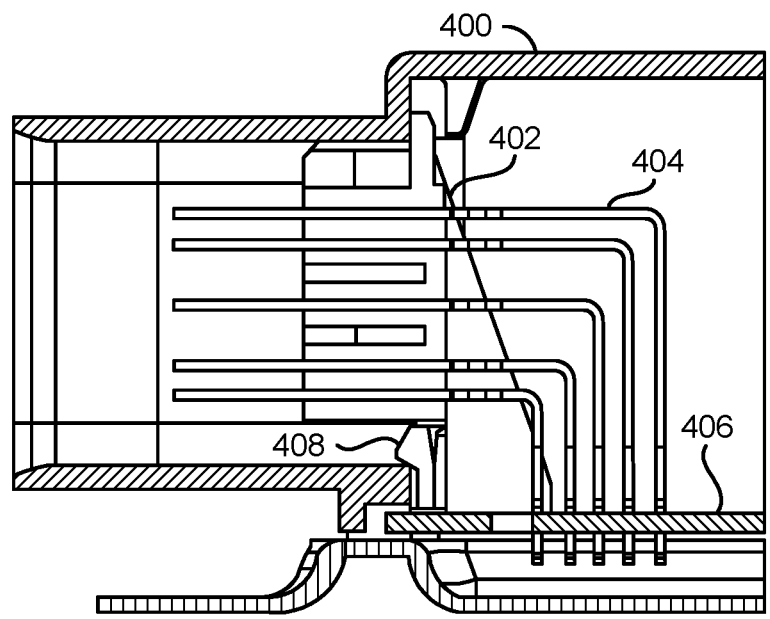
FIG. 18 and FIG. 19 illustrate another example terminal carrier in accordance with still another example embodiment of the invention.
Figure 19:
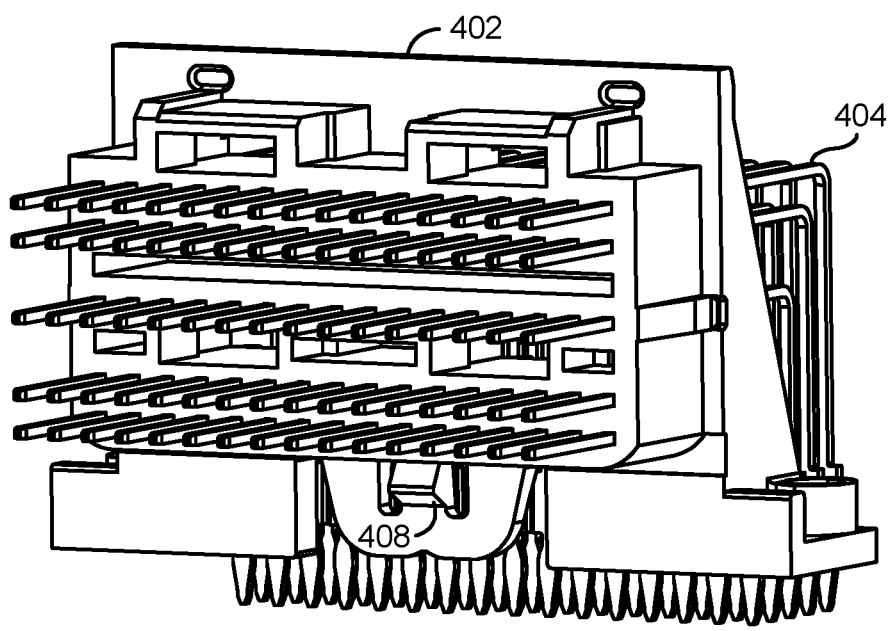

Referring to FIG. 18 and FIG. 19, diagrams are shown illustrating a terminal carrier in accordance with still another example embodiment of the invention. In an example, an upper housing 400 may be configured to accept a circuit board assembly comprising a terminal carrier 402, terminal pins 404, and a printed circuit board substrate 406. The terminal carrier 402 may comprise an upper profile configured to fit into a slot in the upper housing 400 and a latch (or snap feature) 408 configured to retain position of the terminal carrier 402 within a connector shroud of the upper housing 400 during assembly.

Figure 20:
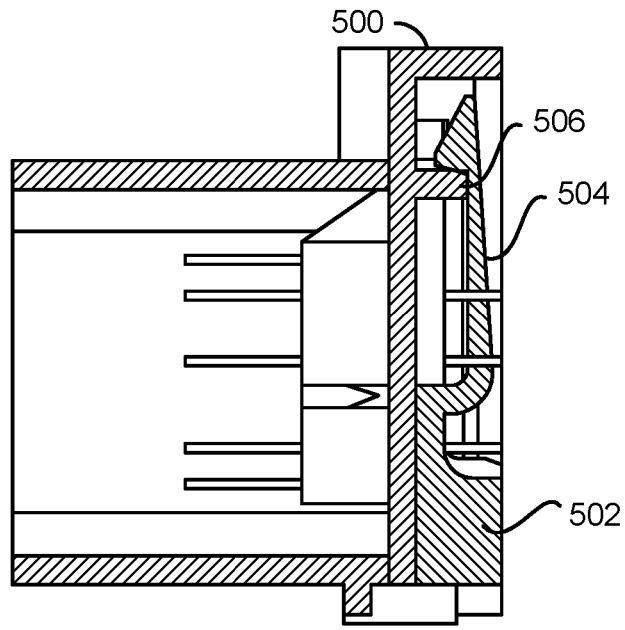
FIG. 20 and FIG. 21 illustrate yet another example embodiment of a terminal carrier in accordance with an example embodiment of the invention.
Figure 21:
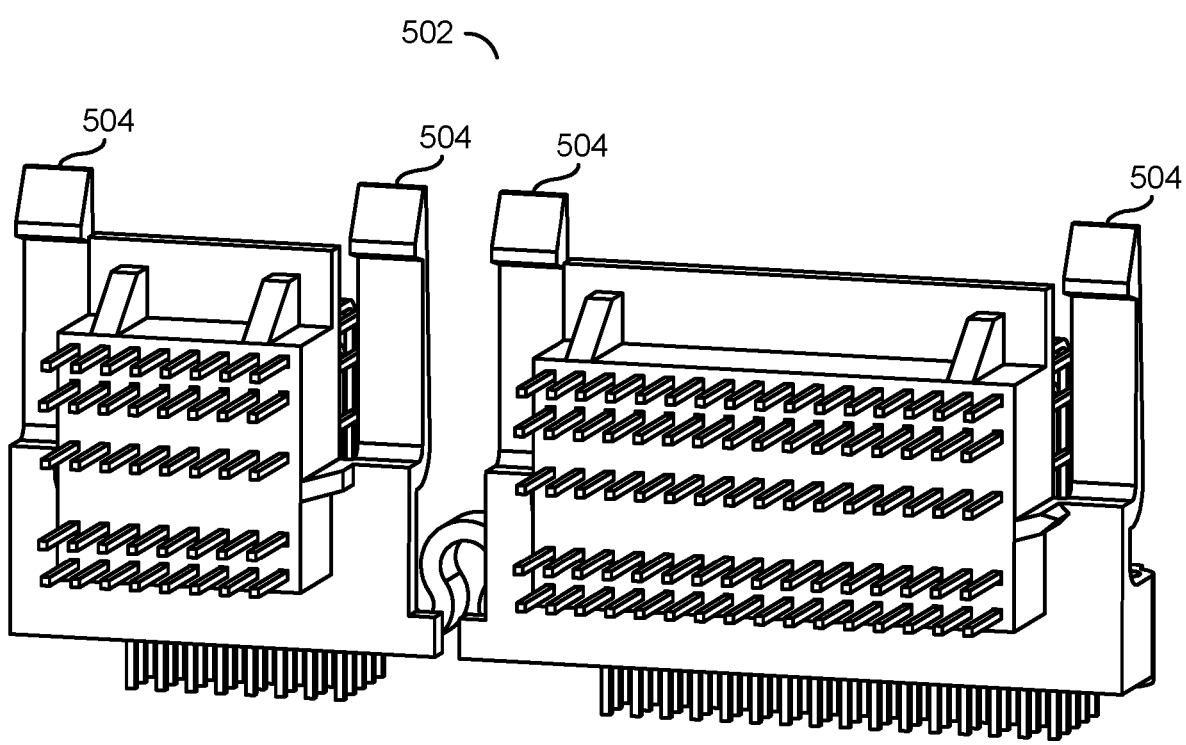

Referring to FIG. 20 and FIG. 21, diagrams are shown illustrating yet another example embodiment of a terminal carrier in accordance with an example embodiment of the invention. In an example, an upper housing 500 may be configured to accept a circuit board assembly comprising a terminal carrier 502. The terminal carrier 502 may comprise latches (or snap features) 504 configured to retain position of the terminal carrier 502 within a connector shroud of the upper housing 500 during assembly. In an example, the latches 504 may have barb-like features that move the latches 504 around a feature 506 of the upper housing 500 as the terminal carrier 502 is inserted into the upper housing 500. When the terminal carrier 502 is in position, the latch 504 may spring back with the barb-like feature of the latches 504 engaging the upper housing feature 506 to hold the terminal carrier 502 in place.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. A method of assembling an electronic control unit comprising:
    assembling a terminal carrier holding a plurality of terminal pins to a printed circuit board substrate, wherein (i) said terminal carrier extends perpendicularly from a first surface of said printed circuit board substrate, (ii) each of said plurality of terminal pins comprises a right angle bend, (iii) a first end of each of said plurality of terminal pins is inserted into said printed circuit board substrate, (iv) a second end of each of said plurality of terminal pins extends through said terminal carrier, and (v) said terminal carrier comprises a first alignment feature and a second alignment feature; and
    assembling said printed circuit board substrate with said terminal carrier and said terminal pins into a housing using a rotational motion followed by a translational motion into the housing in a direction normal to said first surface of said printed circuit board substrate, wherein said housing comprises four sides extending perpendicularly from a fifth side, said sides of said housing define a rectilinear volume, at least one of said four sides comprises a third alignment feature and a fourth alignment feature, said second end of said plurality of terminal pins extend into one or more connector openings in one of said four sides of said housing and said first alignment feature and said second alignment feature of said terminal carrier interlock with said third alignment feature and said fourth alignment feature of said housing during said translational motion to hold said printed circuit board substrate with said terminal carrier and said plurality of terminal pins in place adjacent to said one or more connector openings.

2. The method according to claim 1, further comprising: assembling a base plate to said housing using an adhesive sealant.

3. The method according to claim 1, further comprising: assembling a base plate to said housing using a sealant and a plurality of fasteners.

4. The method according to claim 1, further comprising: assembling a gasket and a base plate to said housing using a plurality of fasteners.

5. The method according to claim 1, wherein said housing further comprises one or more connector shrouds around said one or more connector openings and said one or more connector shrouds form an environmental seal with a connector assembly while said connector assembly is inserted.

6. The method according to claim 5, wherein said environmental seal is formed by a gasket of said connector assembly.

7. The method according to claim 5, wherein said environmental seal is formed by an o-ring on said connector assembly.

8. An apparatus comprising:
    a housing comprising four sides extending perpendicularly from a fifth side, wherein said sides of said housing define a rectilinear volume and one of said four sides comprises one or more connector openings; and
    a circuit assembly comprising a terminal carrier holding a plurality of terminal pins and a printed circuit board substrate, wherein said terminal carrier extends perpendicularly from a first surface of said printed circuit board substrate, each of said plurality of terminal pins comprises a right angle bend, a first end of each of said plurality of terminal pins is inserted into said printed circuit board substrate, a second end of each of said plurality of terminal pins extends through said terminal carrier, and said terminal carrier comprises a first alignment feature and a second alignment feature, wherein (i) said housing is configured to allow assembling of said printed circuit board substrate with said terminal carrier and said plurality of terminal pins into said housing using a rotational motion followed by a translational motion into said housing in a direction normal to said first surface of said printed circuit board substrate, and (ii) a third alignment feature and a fourth alignment feature of said housing interlock with said first alignment feature and said second alignment feature of said terminal carrier during said translational motion to hold said printed circuit board substrate with said terminal carrier and said plurality of terminal pins in place adjacent to said one or more connector openings.

9. The apparatus according to claim 8, further comprising a base plate assembled to said housing using an adhesive sealant.

10. The apparatus according to claim 8, further comprising a base plate assembled to said housing using a sealant and a plurality of fasteners.

11. The apparatus according to claim 8, further comprising a gasket and a base plate assembled to said housing using a plurality of fasteners.

12. The apparatus according to claim 8, wherein said housing further comprises one or more connector shrouds around said one or more connector openings and said one or more connector shrouds form an environmental seal with a connector assembly while said connector assembly is inserted.

13. The apparatus according to claim 12, wherein said environmental seal is formed by a gasket of said connector assembly.

14. The apparatus according to claim 12, wherein said environmental seal is formed by an o-ring on said connector assembly.

15. The apparatus according to claim 8, wherein said first alignment feature comprises an upper profile of said terminal carrier.

16. The apparatus according to claim 15, wherein said third alignment feature comprises a pocket configured to receive said upper profile of said terminal carrier.

17. The apparatus according to claim 8, wherein said second alignment feature comprises an L-shaped feature on each side of said terminal carrier.

18. The apparatus according to claim 17, wherein said fourth alignment feature comprises pockets configured to interlock with the L-shaped feature on each side of the terminal carrier and align the terminal carrier with an interior surface of the side of the housing containing the one or more connector openings.

19. The apparatus according to claim 8, wherein said first alignment feature and said second alignment feature comprise pin features on each side of said terminal carrier.

20. The apparatus according to claim 19, wherein said third alignment feature and said fourth alignment feature comprise cam profiles configured to (i) guide said pin features on each side of said terminal carrier into position within the housing and (ii) provide pockets to interlock with the pin features on each side of the terminal carrier during the translational motion to align the terminal carrier with an interior surface of the side of the housing containing the one or more connector openings.

* * * * *